United States Patent
Kuo

(10) Patent No.: US 12,022,612 B2
(45) Date of Patent: Jun. 25, 2024

(54) CIRCUIT BOARD AND MANUFACTURING METHOD THEREOF

(71) Applicant: Unimicron Technology Corp., Taoyuan (TW)

(72) Inventor: Chun-Hung Kuo, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/662,224

(22) Filed: May 5, 2022

(65) Prior Publication Data

US 2023/0319990 A1    Oct. 5, 2023

(30) Foreign Application Priority Data

Mar. 31, 2022  (TW) .................. 111112648

(51) Int. Cl.
| | | |
|---|---|---|
| *H05K 1/11* | (2006.01) | |
| *H05K 3/46* | (2006.01) | |
| *H05K 1/02* | (2006.01) | |

(52) U.S. Cl.
CPC ........... *H05K 1/111* (2013.01); *H05K 3/4644* (2013.01); *H05K 1/025* (2013.01)

(58) Field of Classification Search
CPC .............................. H05K 1/111; H05K 3/4644
See application file for complete search history.

(56) References Cited

U.S. PATENT DOCUMENTS

| | | | | |
|---|---|---|---|---|
| 8,238,114 B2* | 8/2012 | Niki | ...................... | H05K 3/4682 361/767 |
| 9,510,464 B2* | 11/2016 | Tseng | ...................... | H05K 3/045 |
| 9,538,642 B2* | 1/2017 | Ikeda | ................... | H05K 3/4676 |
| 9,859,159 B2* | 1/2018 | Hu | ........................ | H01L 21/486 |
| 9,875,957 B2* | 1/2018 | Shimizu | ............... | H05K 3/4644 |
| 2009/0301997 A1* | 12/2009 | Liu | ...................... | H05K 3/4661 216/17 |
| 2013/0009306 A1* | 1/2013 | Tseng | ................ | H01L 23/49827 257/737 |
| 2013/0011576 A1* | 1/2013 | Yu | ......................... | H05K 3/107 216/18 |

FOREIGN PATENT DOCUMENTS

| | | |
|---|---|---|
| TW | 243007 B | 11/2005 |
| TW | 200945519 A | 11/2009 |
| TW | 201842234 A | 12/2018 |
| TW | I693874 B | 5/2020 |

\* cited by examiner

*Primary Examiner* — Ishwarbhai B Patel
(74) *Attorney, Agent, or Firm* — CKC & Partners Co., LLC

(57) ABSTRACT

The present disclosure provides a circuit board and its manufacturing method. The circuit board includes a first circuit layer, a first conductive post, and a second circuit layer. The first circuit layer includes a first pad and a first seed layer covering a sidewall of the first pad. The first conductive post is on the first pad and directly connected to the first pad. The second circuit layer includes a second pad and a second seed layer covering a sidewall of the second pad. The second pad is on a first connecting end of the first conductive post. The first connecting end is embedded in the second pad, and the second pad is connected to and directly contacts the first connecting end. The first seed layer and the second seed layer do not extend on a sidewall of the first conductive post.

11 Claims, 21 Drawing Sheets

CIRCUIT BOARD AND MANUFACTURING METHOD THEREOF

CROSS-REFERENCE TO RELATED APPLICATION

This application claims priority to Taiwan Application Serial Number 111112648, filed on Mar. 31, 2022, which is herein incorporated by reference in its entirety.

BACKGROUND

Field of Invention

The present disclosure relates to the circuit board and the manufacturing method thereof. More particularly, the present disclosure relates to the circuit board with the path between the upper and lower circuit layers and the manufacturing method thereof.

Description of Related Art

Along with the fast development of the electronic device, the circuit board in the electronic device needs to rapidly transmit high frequency current signal. However, when the current flows through the elements, such as integrated circuit (IC), in the circuit board, the current signal can be affected by the property difference between elements, for example, impedance mismatching. This leads to the current signal loss. Therefore, the signal transmission quality of the circuit board needs to be maintained or improved to keep up with the development of electronic device.

SUMMARY

According to some embodiments of the present disclosure, a circuit board includes a first circuit layer, a first conductive post, and a second circuit layer. The first circuit layer includes at least one first pad and a first seed layer covering a sidewall of the first pad. The first conductive post is on the first pad and directly connected to the first pad. The second circuit layer includes at least one second pad and a second seed layer covering a sidewall of the second pad. The second pad is on a first connecting end of the first conductive post. The first connecting end is embedded in the second pad, and the second pad is connected to and directly contacts the first connecting end. The first seed layer and the second seed layer do not extend on a sidewall of the first conductive post.

In some embodiments, a top surface cross-sectional area of the first connecting end of the first conductive post is smaller than a bottom surface cross-sectional area of the first conductive post on the first pad.

In some embodiments, an angle between the sidewall of the first conductive post and a top surface of the first pad is an acute angle.

In some embodiments, the first pad and the first conductive post are integrally formed into one piece.

In some embodiments, the circuit board further includes a dielectric layer covering the first circuit layer and surrounding the first conductive post and the second circuit layer, in which the dielectric layer directly contacts the first conductive post.

In some embodiments, the dielectric layer directly contacts a top surface of the first pad.

In some embodiments, the first seed layer further covers a bottom surface of the first pad.

In some embodiments, the second seed layer further covers a bottom surface of the second pad.

In some embodiments, the circuit board further includes a second conductive post below the first pad, in which the second conductive post has a second connecting end embedded in the first pad, and the first pad is connected to and directly contacts the second connecting end.

In some embodiments, the first circuit layer further includes at least one first trace, in which the first seed layer covers a sidewall and a bottom surface of the first trace but not a top surface of the first trace.

In some embodiments, the second circuit layer further includes at least one second trace, in which the second seed layer covers a sidewall and a bottom surface of the second trace but not a top surface of the second trace.

According to some embodiments of the present disclosure, a method of manufacturing the circuit board includes the following steps. A first conductive layer and a first patterned mask layer on the first conductive layer are formed above a substrate. The first conductive layer is patterned by the first patterned mask layer to form at least one first conductive post. A first dielectric layer is formed on the first conductive post and the first patterned mask layer. The first dielectric layer is patterned to form at least one first opening exposing the first patterned mask layer. A first seed layer is formed in the first opening and on the first patterned mask layer. The first patterned mask layer is removed to expose a top surface of the first conductive post. A second conductive layer is formed on the first seed layer and the first conductive post. A second patterned mask layer is formed on the second conductive layer. The second conductive layer is patterned by the second patterned mask layer to form a first pad on the first conductive post and a second conductive post on the first pad. A second dielectric layer is formed on the second conductive post and the second patterned mask layer. The second dielectric layer is patterned to form at least one second opening exposing the second patterned mask layer. A second seed layer is formed in the second opening and on the second patterned mask layer. The second patterned mask layer is removed to expose a top surface of the second conductive post. A second pad is directly formed in the second opening and on the top surface of the second conductive post.

In some embodiments, after the first dielectric layer is patterned, a bottom surface of the first opening is lower than a bottom surface of the first patterned mask layer.

In some embodiments, after the first seed layer is formed, the first seed layer has a bottom film in the first opening. The bottom film is below a bottom surface of the first patterned mask layer and contacts a sidewall of the first conductive post, and a thickness of the bottom film is smaller than that of other portion of the first seed layer.

In some embodiments, after the first seed layer is formed, the first seed layer does not cover an entire sidewall of the first conductive post.

In some embodiments, after the first seed layer is formed, the first seed layer does not cover a bottom surface of the first patterned mask layer.

In some embodiments, after the first patterned mask layer is removed, the top surface of the first conductive post is higher than a bottom surface of the first opening.

In some embodiments, after the second patterned mask layer is formed, the second patterned mask layer is aligned with the first conductive post below the second conductive layer.

In some embodiments, the first patterned mask layer includes a negative photosensitive material, and the first dielectric layer includes a positive photosensitive material.

In some embodiments, patterning the first dielectric layer further includes forming at least one opening in the first dielectric layer, patterning the second conductive layer further includes forming a trace in the opening.

The circuit board and its manufacturing method provided by the embodiments of the present disclosure can reduce the impedance change of the conductive path, thereby reducing the signal loss in the current transmission and improving the signal transmission quality of the circuit board.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
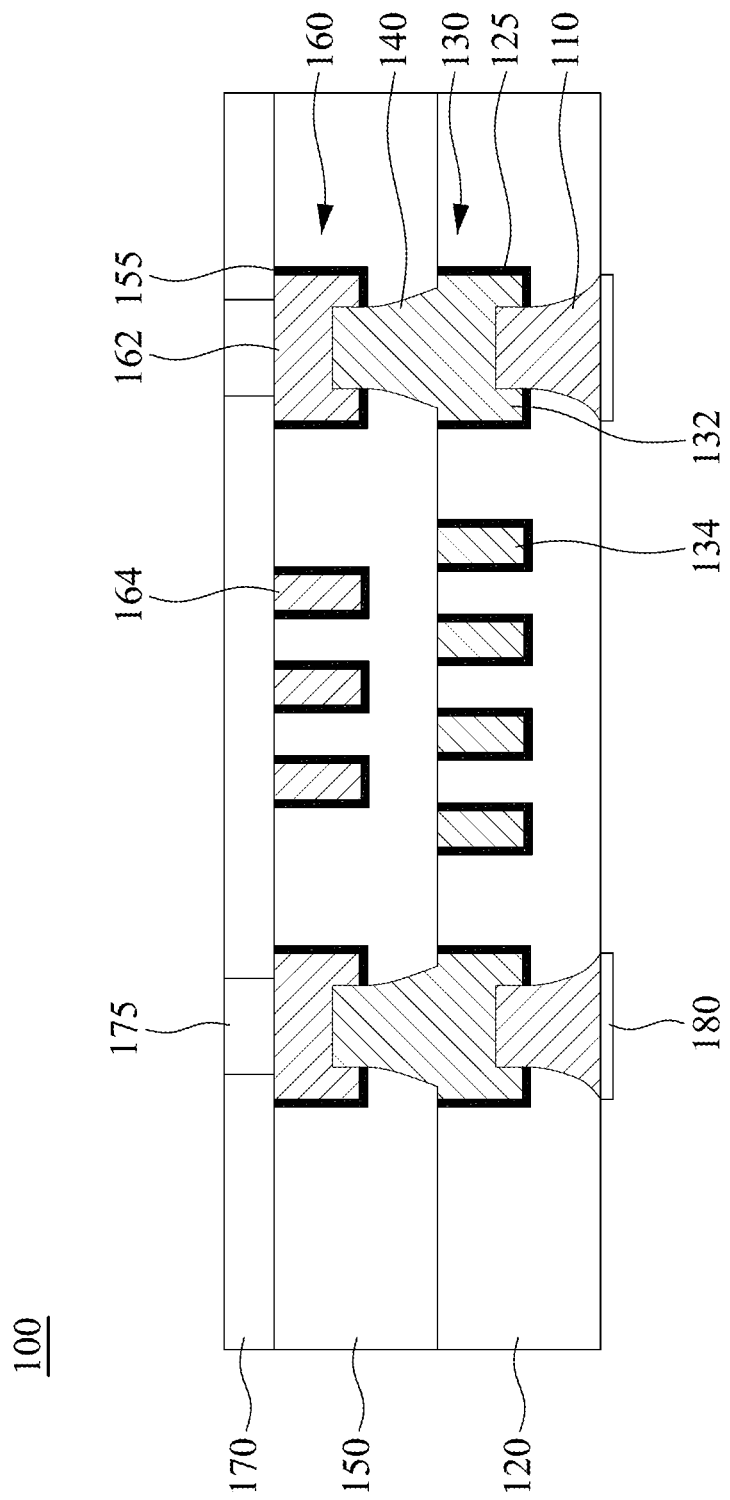
FIG. 1A illustrates a cross-sectional view of a circuit board according to some embodiments of the present disclosure.

The following disclosure provides many different embodiments, or examples, for implementing different features of the provided subject matter. Specific examples of components, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Generally, the current in the circuit board can be transmitted by the blind hole between the upper circuit layer and lower circuit layer, in which the blind hole includes an upper pad, a seed layer, and a lower pad. These pads and the seed layer have different resistivity, while the interface between the pad and the seed layer is a heteroboundary. When the current signal pass through the interface between the pad and the seed layer, the signal loss may happen due to the impedance change.

The present disclosure provides a circuit board having a conductive path for connecting the circuit layers. The circuit board includes a first pad in a first circuit layer, a first conductive post on the first pad, and a second pad in a second circuit layer, in which a connecting end of the first conductive post is embedded in the second pad. The first conductive post is directly connected to the first pad, and the second pad directly contacts the first conductive post. As such, compared to the general blind hole, the conductive path formed by the first pad, the first conductive post, and the second pad has fewer interfaces. This reduces the impedance change of the conductive path, which promotes the impedance matching. Therefore, the circuit board of the present disclosure can reduce the current signal loss and improve the signal transmission quality of the circuit board.

Figure 1B:
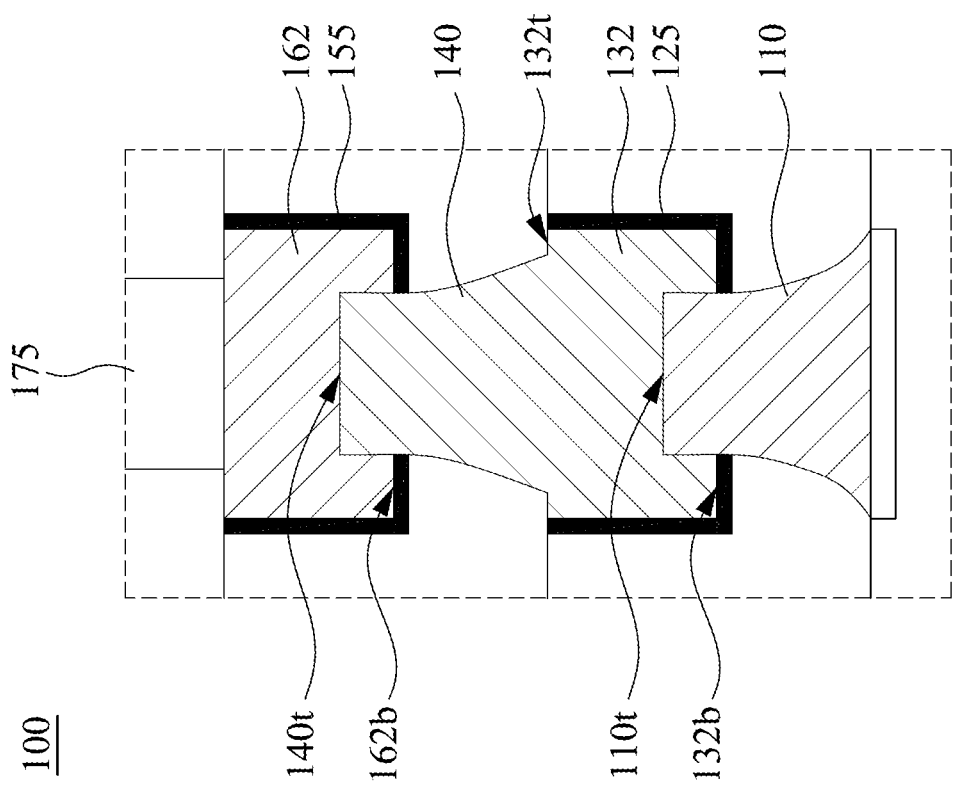
FIG. 1B illustrates a partial enlarged view of the circuit board in FIG. 1A according to some embodiments of the present disclosure.

According to some embodiments of the present disclosure, FIG. 1A illustrates a cross-sectional view of the circuit board 100. FIG. 1B illustrates a partial enlarged view of the circuit board 100 in FIG. 1A. To ease the illustration of the elements included in the circuit board 100, FIG. 1A and FIG. 1B only illustrate part of the elements in the circuit board 100. The circuit board 100 including additional elements not shown in the figures, such as interconnects, system boards electrically connected to the circuit board, etc. is also contemplated in the present disclosure.

Referring to FIG. 1A and FIG. 1B, the circuit board 100 includes a first circuit layer 130, a second circuit layer 160, and a first conductive post 140 connecting the first circuit layer 130 and the second circuit layer 160. Specifically, the first circuit layer 130 includes at least one first pad 132 and a first seed layer 125 covering a sidewall of the first pad 132. The first conductive post 140 is on the first pad 132 and directly connected to the first pad 132 so that a conductive path is formed by the first conductive post 140 and the first pad 132.

The second circuit layer 160 is similar to the first circuit layer 130. The second circuit layer 160 includes at least one second pad 162 and a second seed layer 155 covering a sidewall of the second pad 162. The second pad 162 is on a first connecting end of the first conductive post 140, in which the first connecting end is opposite to the first pad 132. To be more specific, the first connecting end of the first conductive post 140 is embedded in the second pad 162 so that the second pad 162 directly contacts the first connecting end of the first conductive post 140. In other words, the first conductive post 140 is connected to and directly contacts the second pad 162 to form a conductive path between the first conductive post 140 and the second pad 162.

As shown in FIG. 1A and FIG. 1B, the first seed layer 125 and the second seed layer 155 respectively covers the sidewall of the first pad 132 and the sidewall of the second pad 162, but the seed layers do not extend on the sidewall of the first conductive post 140. In other words, the first seed layer 125 does not extend onto the sidewall of the first conductive post 140, so the first seed layer 125 is not formed on the sidewall of the first conductive post 140. The second seed layer 155 does not extend onto the sidewall of the first conductive post 140, so the second seed layer 155 is not formed on the sidewall of the first conductive post 140.

The second conductive post 110, the first pad 132, the first conductive post 140, and the second pad 162 forms a directly connected conductive path, in some embodiments, where the current is transmitted sequentially from the second conductive post 110 to the first pad 132, the first conductive post 140, and the second pad 162 by a bottom-up process. It should be noted that this directly connected conductive path includes neither the first seed layer 125 nor the second seed layer 155. In other words, the first conductive post 140 is directly connected to the first pad 132 without passing through the first seed layer 125, and the first conductive post 140 is directly connected to the second pad 162 without passing through the second seed layer 155. When the current flows in the circuit board 100, the current can directly pass through the first pad 132, the first conductive post 140, and the second pad 162 without the first seed layer 125 or the second seed layer 155. Therefore, compared to the general blind hole, the first pad 132, the first conductive post 140, and the second pad 162 directly connected in the circuit board 100 have fewer interfaces. This reduces the impedance change from the first pad 132 to the second pad 162, thereby reducing the current signal loss.

In some embodiments, the first pad 132 and the first conductive post 140 may be integrally formed into one piece. To be more specific, the first pad 132 and the first conductive post 140 may be formed together in a single process, and both may be formed of the same material so that no seam would exist between the first pad 132 and the first conductive post 140. As a result, the first pad 132 and the first conductive post 140 may form a conductive path improving the quality of the circuit board 100.

In the above-mentioned embodiments, where the first pad 132 and the first conductive post 140 are integrally formed into one piece, the first pad 132 and the first conductive post 140 may include the same conductive material, such as copper metal or alloy. As such, the resistivity of the first pad 132 may be the same as that of the first conductive post 140 to significantly reduce the impedance change between the first pad 132 and the first conductive post 140.

The second pad 162 and the first conductive post 140 has an interface between them. To be more specific, the second pad 162 and the first conductive post 140 may be formed in different processes so that a seam exists between the second pad 162 and the first conductive post 140. As shown in FIG. 1B, the first conductive post 140 is embedded in the second pad 162, leading to a top surface 140t of the first conductive post 140 higher than a bottom surface 162b of the second pad 162. In other words, the second pad 162 wraps at least a portion of the top surface 140t of first conductive post 140 to form a seam between the second pad 162 and the first conductive post 140. As a result, the seam between the second pad 162 and the first conductive post 140 may not be coplanar with the bottom surface 162b of the second pad 162. In some embodiments, the second pad 162 and the first conductive post 140 may include the same material, such as copper metal, so the resistivity of the second pad 162s the same as that of the first conductive post 140. This significantly reduces the impedance change between the second pad 162 and the first conductive post 140.

In some embodiments, the first conductive post 140 may have a tapered profile so that the two ends of the first conductive post 140 have different sizes of cross-sectional area. For example, a width of the first connecting end of the first conductive post 140, which contacts the second pad 162 may be smaller than that of the first conductive post 140 on the first pad 132. As such, a top surface cross-sectional area of the first connecting end of the first conductive post 140 may be smaller than a bottom surface cross-sectional area of the first conductive post 140 on the first pad 132. In addition, the first conductive post 140 may extend from the top surface 132t of the first pad 132 to the interior of the second pad 162, where the sidewall of the first conductive post 140 is not perpendicular to the top surface 132t of the first pad 132. For example, an angle between the sidewall of the first conductive post 140 and the top surface 132t of the first pad 132 may be an acute angle smaller than 90 degrees.

The first seed layer 125 may further cover a bottom surface 132b of the first pad 132 so that the first seed layer 125 covering the sidewall of the first pad 132 and the first seed layer 125 covering the bottom surface 132b of the first pad 132 are connected to each other. In the embodiments shown in FIG. 1B, the first seed layer 125 may not cover a top surface 132t of the first pad 132. The second seed layer 155 may further cover a bottom surface 162b of the second pad 162 so that the second seed layer 155 covering the sidewall of the second pad 162 and the second seed layer 155 covering the bottom surface 162b of the second pad 162 are connected to each other.

The first seed layer 125 and the second seed layer 155 may be composed of the metal material formed in the deposition process, leading to the conformally covering of the first seed layer 125 and the second seed layer 155 on the sidewall of the first pad 132 and the second pad 162. For example, the first seed layer 125 and the second seed layer 155 may include Ti/Cu formed by a sputtering process (sputter Ti/Cu). In some other embodiments, the first seed layer 125 and the second seed layer 155 may include different material compositions. For example, the first seed layer 125 and the first pad 132 may include different metal composition to form an interface between the first seed layer 125 and the first pad 132, in which the first seed layer 125 includes Ti/Cu while the first pad 132 includes copper metal.

In some embodiments, the circuit board 100 may further include a second conductive post 110 below the first pad 132. As shown in FIG. 1B, the second conductive post 110 has a second connecting end that is connected to the first pad 132. The connection between the second conductive post 110 and the first pad 132 is similar to that of the first conductive post 140 and the second pad 162. To be more specific, the second connecting end of the second conductive post 110 may be embedded in the first pad 132, so a top surface 110t of the second conductive post 110 is higher than the bottom surface 132b of the first pad 132. As a result, the second connecting end of the second conductive post 110 can directly contact the first pad 132 without the first seed layer 125 to reduce the impedance change between the second conductive post 110 and the first pad 132.

The circuit board 100 may further include a first dielectric layer 120 and a second dielectric layer 150. The first dielectric layer 120 surrounds the first circuit layer 130. The second dielectric layer 150 covers the first circuit layer 130 while it surrounds the first conductive post 140 and the second circuit layer 160. Specifically, as shown in FIG. 1B, the first dielectric layer 120 contacts the first seed layer 125 in the first circuit layer 130, and the second dielectric layer 150 contacts the second seed layer 155 in the second circuit layer 160 and the first conductive post 140. Since the first seed layer 125 and the second seed layer 155 do not extend on the sidewall of the first conductive post 140, the second dielectric layer 150 may directly contact the sidewall of the first conductive post 140. In some embodiments, the first seed layer 125 does not cover the top surface 132t of the first pad 132 so that the second dielectric layer 150 directly contacts the top surface 132t of the first pad 132.

In some embodiments, the first dielectric layer 120 and the second dielectric layer 150 may be formed of the same dielectric material. For example, the first dielectric layer 120 and the second dielectric layer 150 may include the photo-imageable dielectric (PID). In the embodiments which the first dielectric layer 120 and the second dielectric layer 150 include the same dielectric material, the first dielectric layer 120 and the second dielectric layer 150 may be referred as a single dielectric layer. Although the first dielectric layer 120 and the second dielectric layer 150 are illustrated as a single layer in FIG. 1A and FIG. 1B, the first dielectric layer 120 and the second dielectric layer 150 may include any suitable number of the dielectric layers in other embodiments.

The first circuit layer 130 may further include at least one first trace 134, and the second circuit layer 160 may further include at least one second trace 164, as shown in FIG. 1A. The first trace 134 and the first pad 132 may be arranged as one patterned metal layer, while the second trace 164 and the second pad 162 may be arranged as another patterned metal layer. The first seed layer 125 may cover a sidewall and a bottom surface of the first trace 134, but it does not cover a top surface of the first trace 134. Similarly, the second seed layer 155 may cover a sidewall and a bottom surface of the second trace 164 but not a top surface of the second trace 164.

The circuit board 100 may further include a solder bump 175 on the second pad 162 and an insulation protecting layer 170 on the second dielectric layer 150, in which the insulation protecting layer 170 surrounds the solder bump 175. The second pad 162 may be electrically connected to the elements (not shown in figures) disposed on the circuit board 100 by the solder bump 175, which allows the current signal transmission to the elements. The circuit board 100 also may further include a solder bump 180 below the first dielectric layer 120, in which the solder bump 180 is connected to the second conductive post 110. The second conductive post 110 may be electrically connected to other elements or circuit boards (not shown in figures) by the solder bump 180, which allows the current signal transmission to the other elements or circuit boards. It should be noted that the solder bump 175 and the solder bump 180 are merely examples for the circuit board 100 to be electrically connected with other element and are not intended to limit the present disclosure.

In addition, in other embodiments, the circuit board 100 may be a multilayer circuit board having a core layer. For example, the circuit board 100 may include a core layer (not shown in figures) which may include circuit layers. The first circuit layer 130 and the second conductive post 110 then may be directly formed on the core layer. As such, the second conductive post 110, the first circuit layer 130, the first conductive post 140, the second circuit layer 160 are directly electrically connected to the circuit layer in the core layer, leading to a high density of the interconnects.

According to some embodiments of the present disclosure, FIG. 2A through FIG. 2E, FIG. 2H, FIG. 2J, FIG. 2K, and FIG. 2M through FIG. 2S illustrate cross-sectional views of the circuit board in respective intermediate stage of the manufacturing method. The method illustrated in FIG. 2A through FIG. 2E, FIG. 2H, FIG. 2J, FIG. 2K, and FIG. 2M through FIG. 2S may be used for the circuit board of the present disclosure, for example, the circuit board 100 in FIG. 1A.

Unless otherwise illustrated, the order in which some or all operations in FIG. 2A through FIG. 2E, FIG. 2H, FIG. 2J, FIG. 2K, and FIG. 2M through FIG. 2S are described should not be construed to imply that these operations are necessarily order dependent. Alternative ordering will be appreciated having the benefit of this description. Further, it will be understood that not all operations are necessarily present in each embodiment provided herein. It will also be understood that some operations can be performed simultaneously or repeated in some embodiments. Additional operations can be provided before, during, and/or after these operations to form the circuit board herein.

Figure 2A:
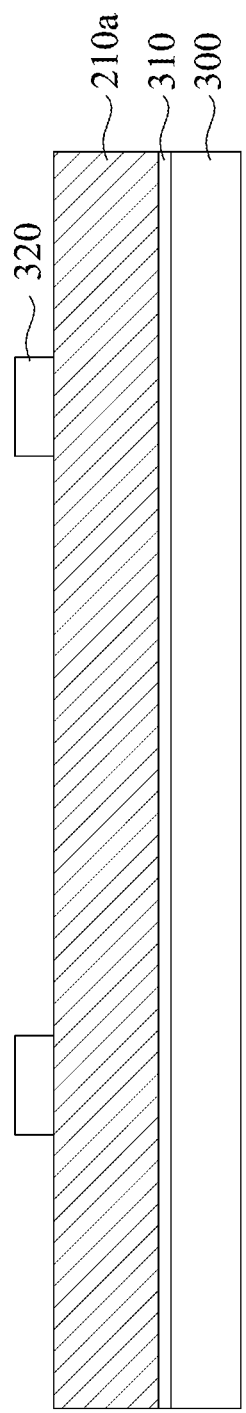
FIG. 2A through FIG. 2E, FIG. 2H, FIG. 2J, FIG. 2K, and FIG. 2M through FIG. 2S illustrate cross-sectional views of the circuit board in respective manufacturing intermediate stage according to some embodiments of the present disclosure.

Referring to FIG. 2A, a first conductive layer 210a and a first patterned mask layer 320 on the first conductive layer 210a are formed above a substrate 300. Specifically, the substrate 300 is referred as a carrier substrate so the first conductive layer 210a is formed above the substrate 300. Then, a mask layer is formed, exposed, and developed on a top surface of the first conductive layer 210a to form the first patterned mask layer 320. The first patterned mask layer 320 has the pattern corresponding to the later formed conductive post (for example, the first conductive post 210 in FIG. 2B), leading to the conductive post in the circuit board formed by the first patterned mask layer 320 in the subsequent process.

In some embodiments, the substrate 300 may have a flat surface so that the first conductive layer 210a above the substrate 300 also has a flat top surface. For example, the substrate 300 may be a glass substrate. In some embodiments, as shown in FIG. 2A, the substrate 300 may further include a release film 310, so the first conductive layer 210a is formed on the release film 310. The release film 310 promotes the components, such as the conductive post formed form the first conductive layer 210a, on the release film 310 to release from the substrate 300. This helps the circuit board to leave from the substrate 300 in the subsequent process (as shown in FIG. 2S).

In some other embodiments, the substrate 300 may be a core layer including circuit layers and insulation material layers. For example, the first conductive layer 210a may be directly formed on the upper surface of the substrate 300 as a core layer, leading to the electrical connection between the first conductive layer 210a and the circuit layers in the substrate 300. As such, the first conductive layer 210a and the subsequently formed elements (for example, the second conductive layer 230a shown in FIG. 2J) above the first conductive layer 210a form a build-up structure.

The first conductive layer 210a and the subsequently formed elements may be referred as a one-side build-up structure on the substrate 300. In other examples, the first conductive layer 210a and the subsequently formed elements above the first conductive layer 210a may be formed on both the upper surface and lower surface of the substrate 300, which the substrate 300 is positioned between the two build-up structures to prevent the substrate 300 from bending.

In some embodiments, the first conductive layer 210a may include the metal material formed by the deposition process, such as copper metal or alloy formed by evaporation, sputtering, platting, other suitable deposition process, or combinations thereof. Before forming the first conductive layer 210a, a seed layer (not shown in figures) for platting may be first formed above the substrate 300 to help the platting of the first conductive layer 210a above the substrate 300. In addition, the above-mentioned seed layer may be Ti/Cu which may be formed by evaporation, sputtering, or chemical platting. After forming the first conductive layer 210a and before forming the first patterned mask layer 320, a planarization process, such as chemical mechanical polishing (CMP), may be performed on the first conductive layer 210a to form a first conductive layer 210a with the flat top surface.

Referring to FIG. 2A, the mask layer may include a negative photosensitive material so that the negative photosensitive material cured by the light source remains on the first conductive layer 210a to form the first patterned mask layer 320. Since the mask layer includes the negative photosensitive material, the negative photosensitive material can be exposed by the precise light source and developed to form the first patterned mask layer 320. This allows the first patterned mask layer 320 with the negative photosensitive material to have the fine pattern.

Figure 2B:
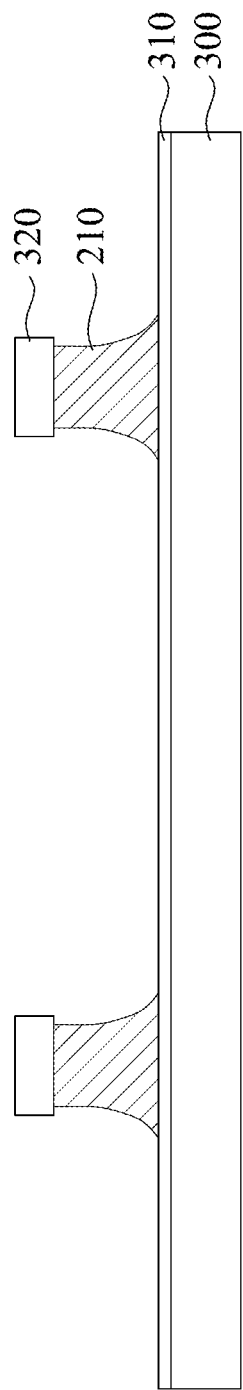

Referring to FIG. 2B, the first conductive layer 210a is patterned by the first patterned mask layer 320 to form at least one first conductive post 210. Specifically, an etching process is performed on the first conductive layer 210a by using the first patterned mask layer 320, thereby patterning the first conductive layer 210a into the first conductive post 210. During the etching process, the first patterned mask layer 320 serves as an etching mask so that the first conductive layer 210a below the first patterned mask layer 320 is remained above the substrate 300 to form the first conductive post 210. The other portions of the first conductive layer 210a is removed from the substrate 300. It should be noted that the first conductive post 210 in FIG. 2B may be the second conductive post 110 in FIG. 1A, and it is not intended to limit the present disclosure.

In some embodiments, a wet etching process may be performed on the first conductive layer 210a. The etchant used in the wet etching process have etching selectivity to the metal material to prevent the first patterned mask layer 320 from being damaged by the etchant during the etching of the first conductive layer 210a. Therefore, the pattern of the first patterned mask layer 320 basically does not change in the etching process so that the position and the size of the first conductive post 210 is in the acceptable tolerance range.

An isotropic etching may be performed on the first conductive layer 210a by the etchant used in the etching process, so the first conductive post 210 is formed with the tapered profile. For example, after forming the first conductive post 210, a width of the top surface of the first conductive post 210 may be smaller than that of the first patterned mask layer 320, while a width of the bottom surface of the first conductive post 210 is larger than or close to that of the first patterned mask layer 320. In addition, as shown in FIG. 2B, the isotropic etching to the first conductive layer 210a by the etching process may also form the sidewall of the first conductive post 140 which is not perpendicular to the top surface of the substrate 300.

Figure 2C:
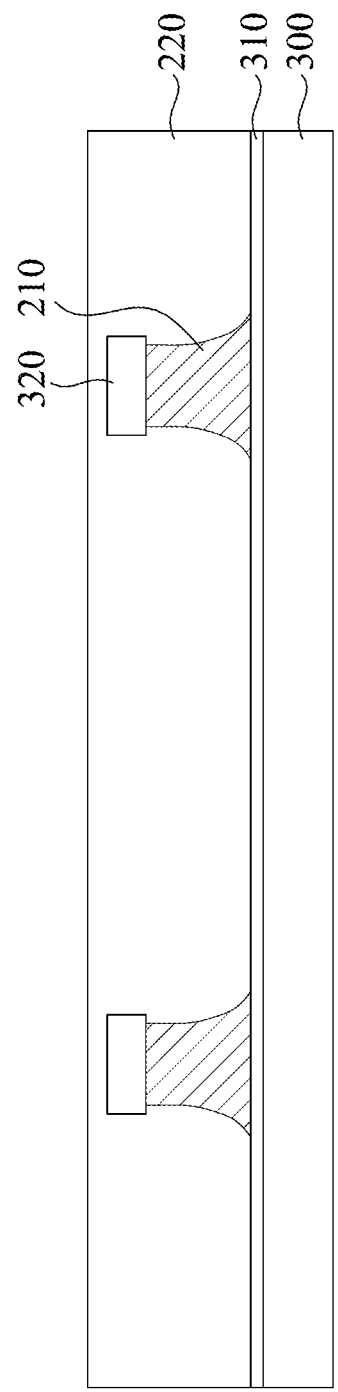

Referring to FIG. 2C, a first dielectric layer 220 is formed on the first conductive post 210 and the first patterned mask layer 320. Specifically, the dielectric material is formed above the substrate 300, thereby forming the first dielectric layer 220 surrounding and wrapping the first conductive post 210 and the first patterned mask layer 320. In some embodiments, the first dielectric layer 220 may further cover the first patterned mask layer 320 so that the top surface of the first dielectric layer 220 is higher than the top surface of the first patterned mask layer 320.

Figure 2D:
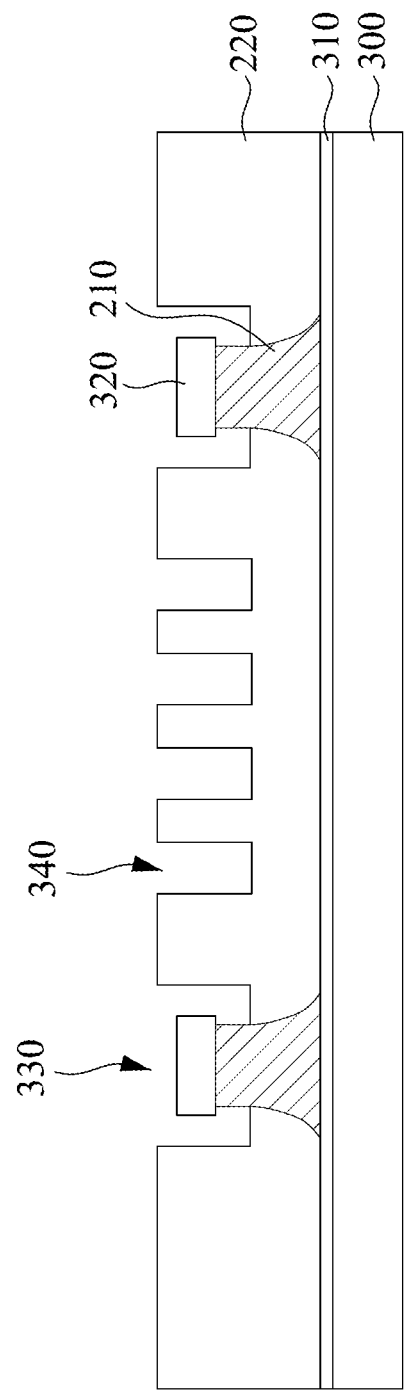

Referring to FIG. 2D, the first dielectric layer 220 is patterned to form at least one first opening 330 exposing the first patterned mask layer 320. Specifically, the first dielectric layer 220 includes the photoimageable dielectric, so the first dielectric layer 220 can be exposed and developed to form the first opening 330 in the first dielectric layer 220. The first opening 330 has sufficient area so that the first patterned mask layer 320 may be totally exposed in the first opening 330. For example, a width of the first opening 330 may be larger than that of the first patterned mask layer 320, so the sidewall of the first patterned mask layer 320 is exposed in the first opening 330.

In some embodiments, the first patterned mask layer 320 and the first dielectric layer 220 may include different photosensitive materials so that the first patterned mask layer 320 would not be removed during the patterning process of the first dielectric layer 220. For example, the first patterned mask layer 320 may include the negative photosensitive material, while the first dielectric layer 220 includes the positive photosensitive material.

In some embodiments which the first patterned mask layer 320 includes the negative photosensitive material, the first patterned mask layer 320 is cured by being exposed in the earlier steps. When the portion of the first dielectric layer 220 expected to form the first opening 330 is exposed, the first patterned mask layer 320 in the first dielectric layer 220 may remain the cured state and would not be removed by the developer that develops the first dielectric layer 220. As a result, after the first opening 330 is formed in the developed first dielectric layer 220, the first patterned mask layer 320 may remain on the first conductive post 210.

In some embodiments, after patterning the first dielectric layer 220, the bottom surface of the first opening 330 may be lower than the bottom surface of the first patterned mask layer 320. As such, the bottom surface of the first patterned mask layer 320 is exposed in the first opening 330. In the embodiments which the bottom surface of the first opening 330 is lower than the bottom surface of the first patterned mask layer 320, a portion of the sidewall of the first conductive post 210 may also be exposed in the first opening 330.

Patterning the first dielectric layer 220 may further include forming the opening 340 in the first dielectric layer 220. The opening 340 may be positioned in the same patterned layer as the first opening 330, and the opening 340 may have a shape different from that of the first opening 330. For example, the first dielectric layer 220 may be exposed by using the three dimensional (3D) exposing techniques so that the width or the depth of the opening 340 is different from that of the first opening 330.

Figure 2E:
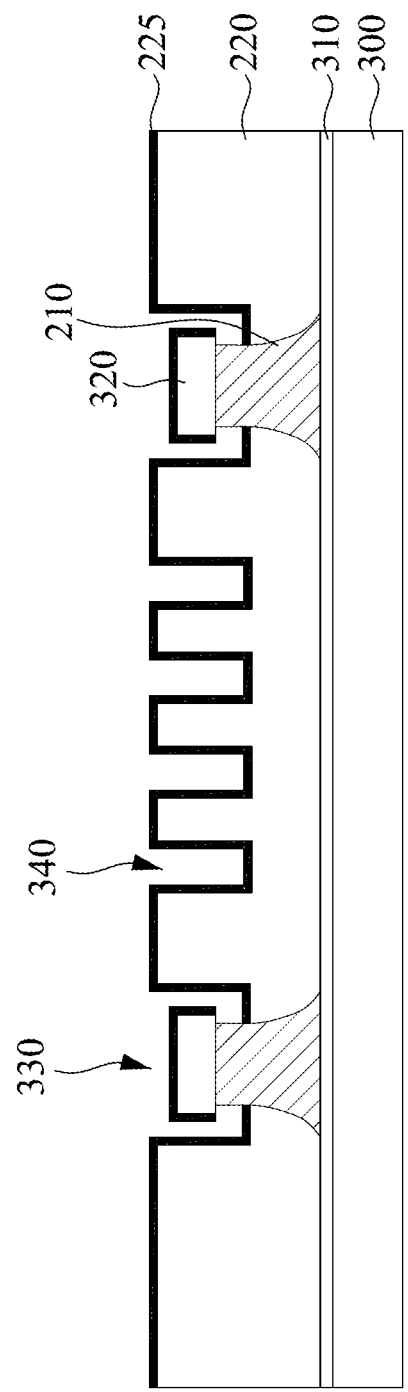

Referring to FIG. 2E, a first seed layer 225 is formed in the first opening 330 and on the first patterned mask layer 320. For example, the first seed layer 225 may be formed on the first dielectric layer 220 and the first patterned mask layer 320 by sputtering. As a result, the first seed layer 225 covers the top surfaces of the first dielectric layer 220 and the first patterned mask layer 320, and the first seed layer 225 also covers the sidewall and the bottom surface of the first opening 330. The first seed layer 225 may be Ti/Cu. In the embodiments which the first dielectric layer 220 includes the opening 340, the first seed layer 225 may also be formed in the opening 340 so that the first seed layer 225 covers the sidewall and the bottom surface of the opening 340.

Figure 2F:
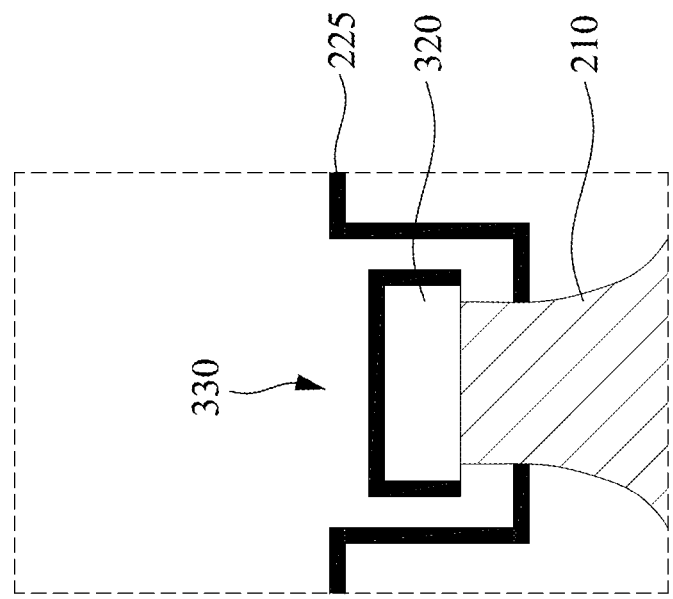
FIG. 2F illustrates a partial enlarged view of the circuit board in FIG. 2E according to some embodiments of the present disclosure.

According to some embodiments of the present disclosure, FIG. 2F illustrates a partial enlarged view of the circuit board in FIG. 2E. As shown in FIG. 2F, the first seed layer 225 formed by sputtering would be formed on portions of the surface of each element. Take FIG. 2F as an example, the width of the first opening 330 is larger than that of the first patterned mask layer 320, so the first seed layer 225 may be formed on the sidewall of the first patterned mask layer 320. The first seed layer 225 may not cover the bottom surface of the first patterned mask layer 320.

In some embodiments, the bottom surface of the first opening 330 may be lower than the bottom surface of the first patterned mask layer 320, so the first seed layer 225 in the first opening 330 may be formed right below the first patterned mask layer 320 and on the surface of the first dielectric layer 220. This portion of the first seed layer 225 right below the first patterned mask layer 320 may be referred as a bottom film in the first opening 330. The bottom film is on the surface of the first dielectric layer 220 and contacts the sidewall of the first conductive post 210, in which the projection of the first patterned mask layer 320 is partially overlayed with the bottom film.

Figure 2G:
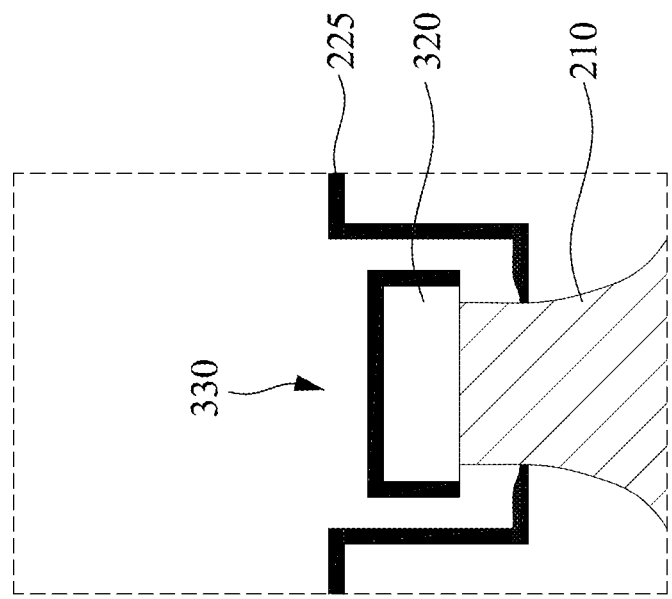
FIG. 2G illustrates a partial enlarged view of another circuit board according to some other embodiments of the present disclosure.

Since the first patterned mask layer 320 slightly block the sputtering direction of the first seed layer 225, the thickness of the bottom film may be smaller than that of other portions of the first seed layer 225. For example, FIG. 2G illustrates a partial enlarged view of a circuit board according to some other embodiments of the present disclosure. As shown in FIG. 2G, the thickness of the bottom film right below the first patterned mask layer 320 is smaller than that of the first seed layer 225 on the sidewall of the first opening 330. In some embodiments, the first opening 330 may expose portion of the sidewall of the first conductive post 210, so the first seed layer 225 in the first opening 330 contacts the portion of the sidewall of the first conductive post 210 but does not cover the entire sidewall of the first conductive post 210.

Figure 2H:
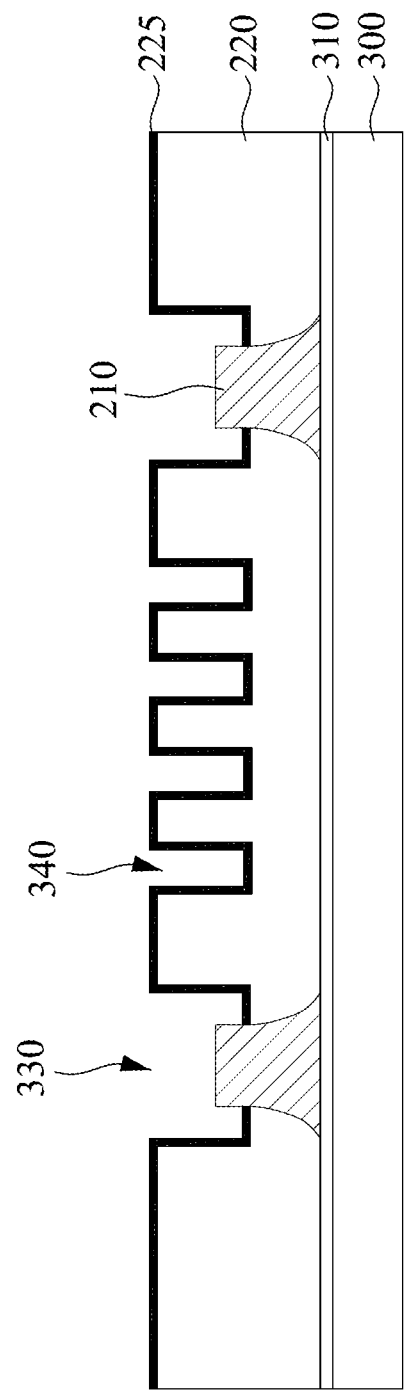

Referring to FIG. 2H, the first patterned mask layer 320 is removed to expose the top surface of the first conductive post 210. Specifically, the removing process may be performed on the first patterned mask layer 320, for example, by using the stripper so that the top surface of the first conductive post 210 may be exposed in the first opening 330.

Figure 2I:
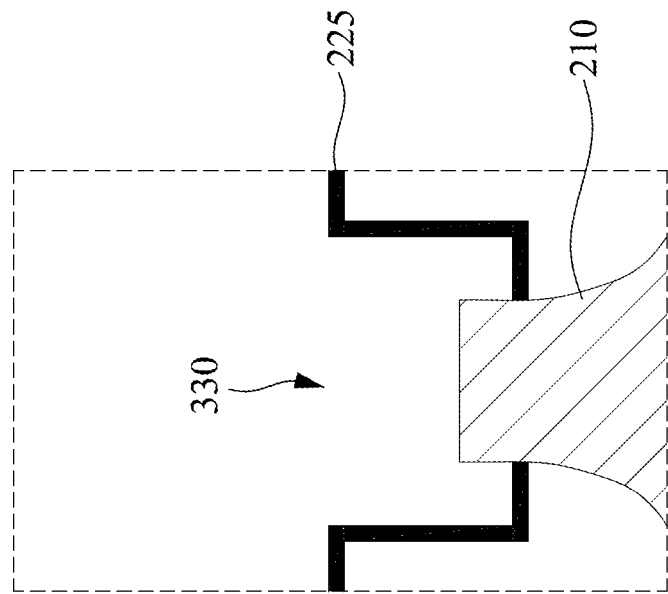
FIG. 2I illustrates a partial enlarged view of the circuit board in FIG. 2H according to some embodiments of the present disclosure.

According to some embodiments of the present disclosure, FIG. 2I illustrates a partial enlarged view of the circuit board in FIG. 2H. As shown in FIG. 2I, the removing process removes the first patterned mask layer 320 and the first seed layer 225 on the first patterned mask layer 320 and does not affect the first conductive post 210 of other portions of the first seed layer 225. In some embodiments, the bottom surface of the first opening 330 may be lower than the bottom surface of the first patterned mask layer 320, so the top surface of the first conductive post 210 is higher than the bottom surface of the first opening 330 after removing the first patterned mask layer 320.

Figure 2J:
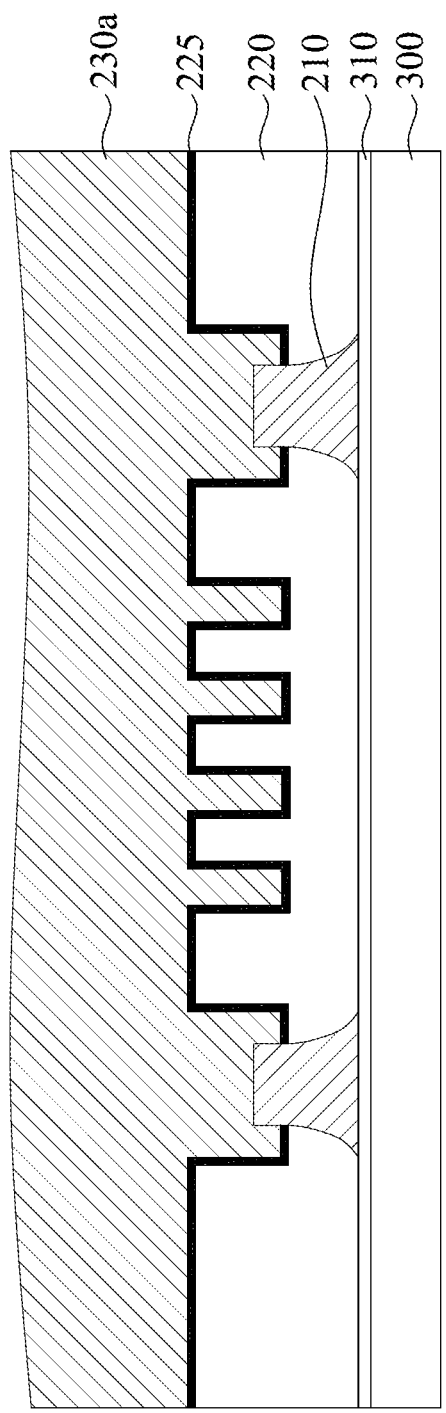

Referring to FIG. 2J, a second conductive layer 230a is formed on the first seed layer 225 and the first conductive post 210. Specifically, the second conductive layer 230a is formed on the first dielectric layer 220 so that the second conductive layer 230a fills the first opening 330 and is further formed on the first seed layer 225. When the second conductive layer 230a fills the first opening 330, the second conductive layer 230a may directly contact the first conductive post 210 to form a conductive path between the second conductive layer 230a and the first conductive post 210 without the first seed layer 225. In some embodiments, the second conductive layer 230a and the first conductive post 210 may include the same metal material, such as copper metal formed by the platting process.

In some embodiments, the top surface of the first conductive post 210 may be higher than the bottom surface of the first opening 330, so the second conductive layer 230a filling the first opening 330 wraps the top surface of the first conductive post 210. In other words, the first conductive post 210 is embedded in the second conductive layer 230a. As such, the first conductive post 210 may be connected to and directly contact the second conductive layer 230a, thereby forming the conductive path with low impedance change. In the embodiments which the first dielectric layer 220 includes the opening 340, the second conductive layer 230a may also be formed on the first seed layer 225 in the opening 340, so the second conductive layer 230a fills the opening 340.

Figure 2K:
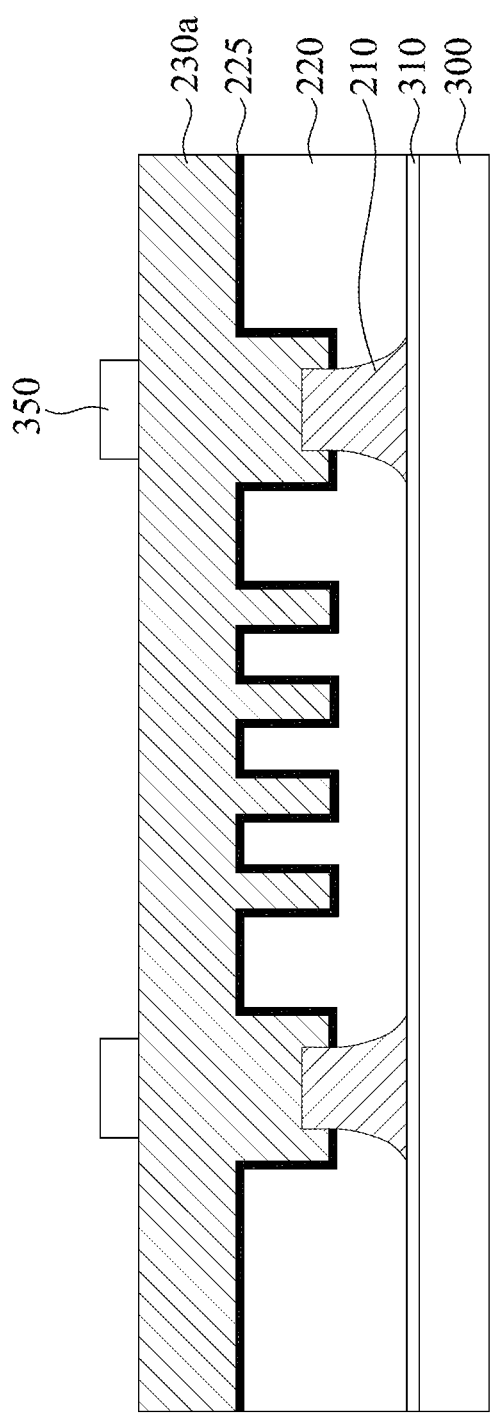

Referring to FIG. 2K, a second patterned mask layer 350 is formed on the second conductive layer 230a. Specifically, a mask layer is formed, exposed, and developed on the top surface of the second conductive layer 230a to form the second patterned mask layer 350. The method of forming the second patterned mask layer 350 may be similar to the above-mentioned one for the first patterned mask layer 320 in FIG. 2A. For example, the mask layer may include a negative photosensitive material, so the negative photosensitive material can be exposed by the precise light source and developed to form the second patterned mask layer 350 having the negative photosensitive material.

After forming the second conductive layer 230a and before forming the second patterned mask layer 350, a planarization process may be performed on the second conductive layer 230a to form the second conductive layer 230a with a flat top surface. In the above-mentioned embodiments, after performing the planarization process, the top surface of the second conductive layer 230a may be higher than the first seed layer 225 on the first dielectric layer 220. This leads to the separation between the second patterned mask layer 350 and the first seed layer 225 in vertical direction, i.e., the second patterned mask layer 350 and the first seed layer 225 does not directly contacts each other.

Figure 2L:
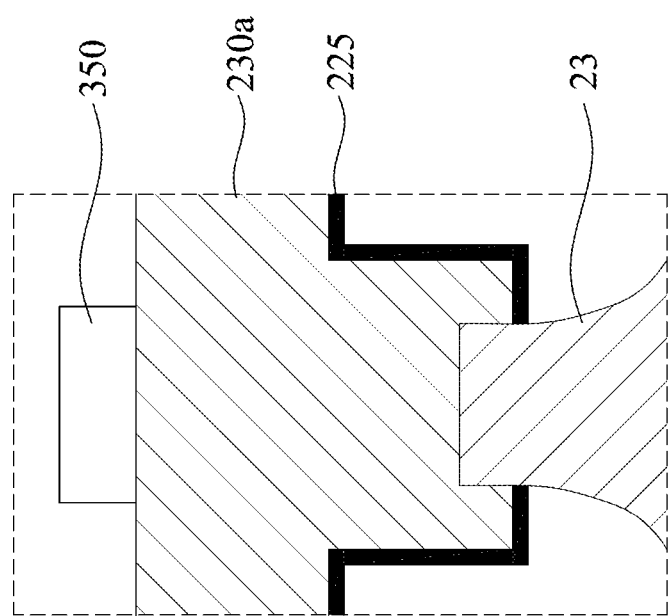
FIG. 2L illustrates a partial enlarged view of the circuit board in FIG. 2K according to some embodiments of the present disclosure illustrates.

According to some embodiments of the present disclosure, FIG. 2L illustrates a partial enlarged view of the circuit board in FIG. 2K. As shown in FIG. 2L, the second patterned mask layer 350 has the patterns corresponding to the conductive post (for example, the second conductive post 240 in FIG. 2M) and the pad (for example, the first pad 232 in FIG. 2M.) This allows the formation of the conductive post and the pad in the circuit board by using the second patterned mask layer 350 in the subsequent process. Specifically, the pattern of the second patterned mask layer 350 may be aligned with the first opening 330 in FIG. 2H to form the conductive post connected to the pad in the later process. In some embodiments, the second patterned mask layer 350 may be further aligned with the first conductive post 210 below the second conductive layer 230a, so the vertical projection of the later formed conductive post on the substrate 300 overlays the vertical projection of the first conductive post 210 on the substrate 300.

Figure 2M:
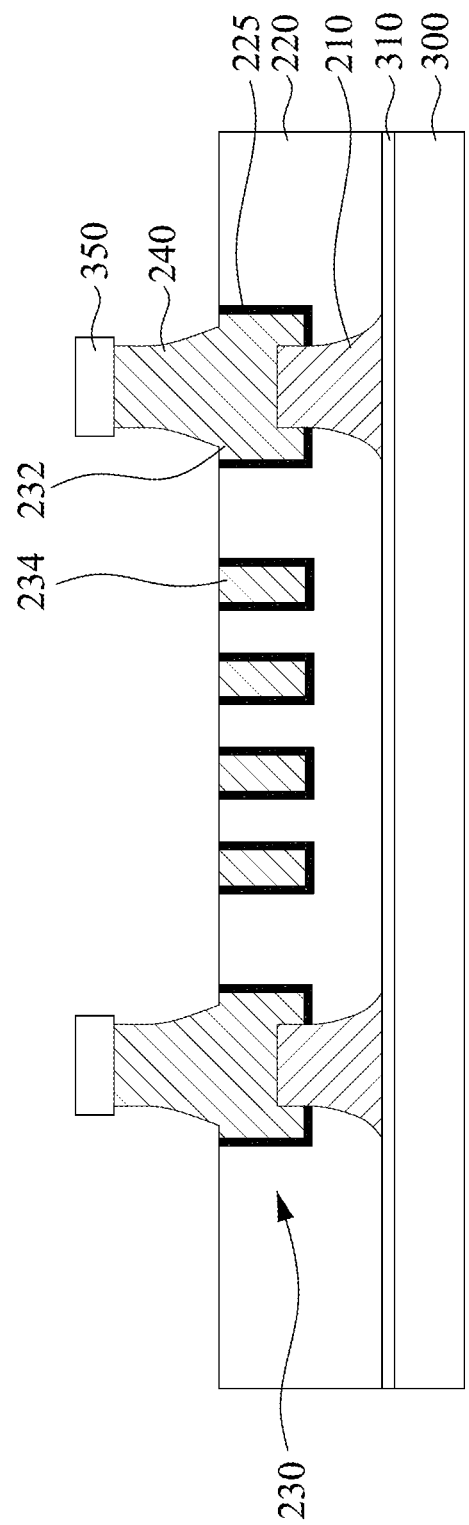

Referring to FIG. 2M, the second conductive layer 230a is patterned by the second patterned mask layer 350 to form the first pad 232 on the first conductive post 210 and the second conductive post 240 on the first pad 232. Specifically, an etching process is performed on the second conductive layer 230a by using the second patterned mask layer 350 as the etching mask, thereby patterning the second conductive layer 230a into the first pad 232 in the opening (for example, the first opening 330 in FIG. 2H) and the second conductive post 240 on the first pad 232. The method of patterning the second conductive layer 230a may be similar to the above-mentioned one for the first conductive layer 210a in FIG. 2B. It should be noted that the second conductive post 240 in FIG. 2M may be the first conductive post 140 in FIG. 1A, and it is not intended to limit the present disclosure.

As shown in FIG. 2M, the patterned first pad 232 directly contacts the first conductive post 210 so that the first pad 232 and the first conductive post 210 forms a conductive path with low impedance change. This reduces the signal loss when the current passes through the first pad 232 and the first conductive post 210. It should be noted that, in this embodiment, the first pad 232 and the second conductive post 240 are formed from the second conductive layer 230a which is manufactured in a single step. As a result, no seam exists between the first pad 232 and the second conductive post 240, which indicates that the first pad 232 and the second conductive post 240 are integrally formed into one piece. In contrast, the first conductive post 210 and the first pad 232 are respectively formed from the first conductive layer 210a and the second conductive layer 230a manufactured in different steps, the seam may exist between the first conductive post 210 and the first pad 232.

In some embodiments, the vertical projection of the second conductive post 240 on the substrate 300 may overlap with the vertical projection of the first conductive post 210 on the substrate 300, so the second conductive post 240 and the first conductive post 210 forms the coaxial conductive path. In some other embodiments, the second conductive post 240 may be connected to the first conductive post 210 by the first pad 232, and the vertical projection of the second conductive post 240 on the substrate 300 deviates from the vertical projection of the first conductive post 210 on the substrate 300.

In addition, the width of the second patterned mask layer 350 may be smaller than that of the first opening 330 in FIG. 2H. Therefore, after forming the second conductive post 240 by the second patterned mask layer 350, the width of the bottom surface of the second conductive post 240 may be smaller than that of the top surface of the first pad 232, which exposes portion of the top surface of the first pad 232.

In the embodiments which the first dielectric layer 220 includes the opening 340, patterning the second conductive layer 230a may further include forming the first trace 234 in the opening 340. In the above-mentioned embodiments, the first pad 232 and the first trace 234 may be formed in the same patterned metal layer, i.e., the first circuit layer 230. In some embodiments, after forming the first pad 232 and the second conductive post 240, the first seed layer 225 on the first dielectric layer 220 may be removed. The resulted first seed layer 225 covers the sidewalls and the bottom surfaces of the first pad 232 and the first trace 234 but does not cover the top surfaces of the first pad 232 and the first trace 234. For example, the etching process which patterns the second conductive layer 230a may simultaneously remove the first seed layer 225 on the first dielectric layer 220, so the formed first seed layer 225 does not cover the top surfaces of the first pad 232 and the first trace 234.

Figure 2N:
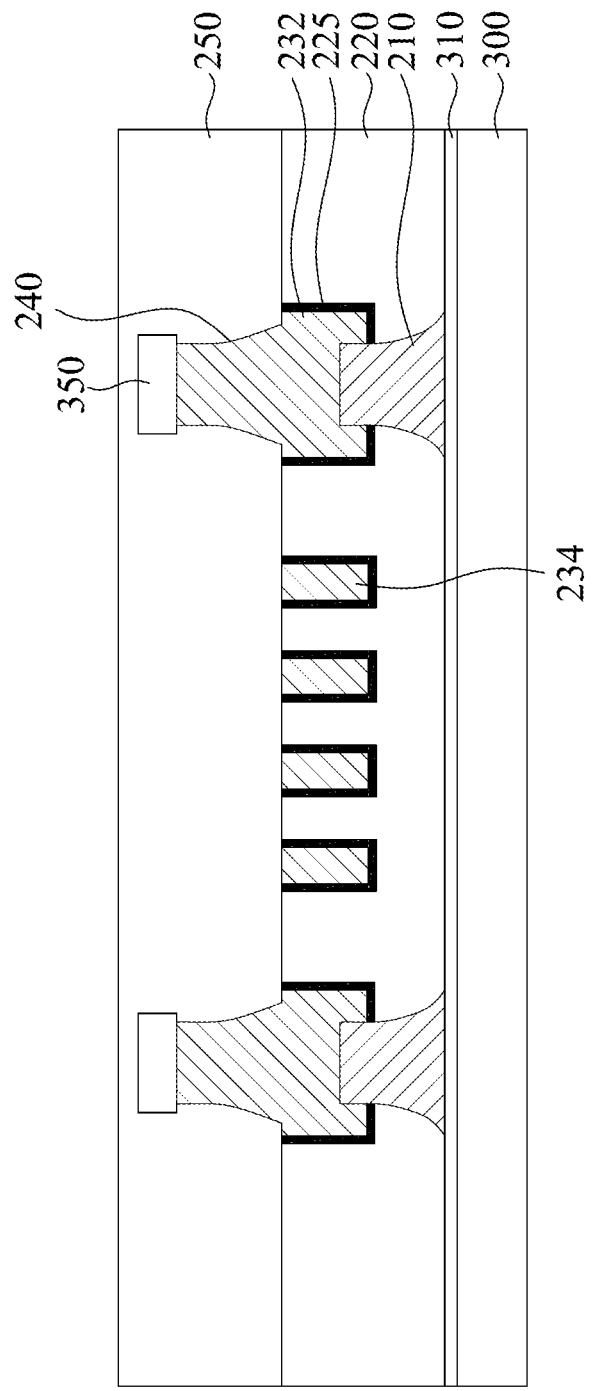

Referring to FIG. 2N, a second dielectric layer 250 is formed on the second conductive post 240 and the second patterned mask layer 350. Specifically, the dielectric material is formed on the first dielectric layer 220, thereby forming the second dielectric layer 250 surrounding and wrapping the second conductive post 240. The second dielectric layer 250 also covers the first pad 232 and the second patterned mask layer 350. The method of forming the second dielectric layer 250 may be similar to the above-mentioned one for the first dielectric layer 220 in FIG. 2C. In some embodiments, the first dielectric layer 220 and the second dielectric layer 250 may include the same photoimageable dielectric. For example, the second dielectric layer 250 may include the positive photosensitive material.

Figure 2O:
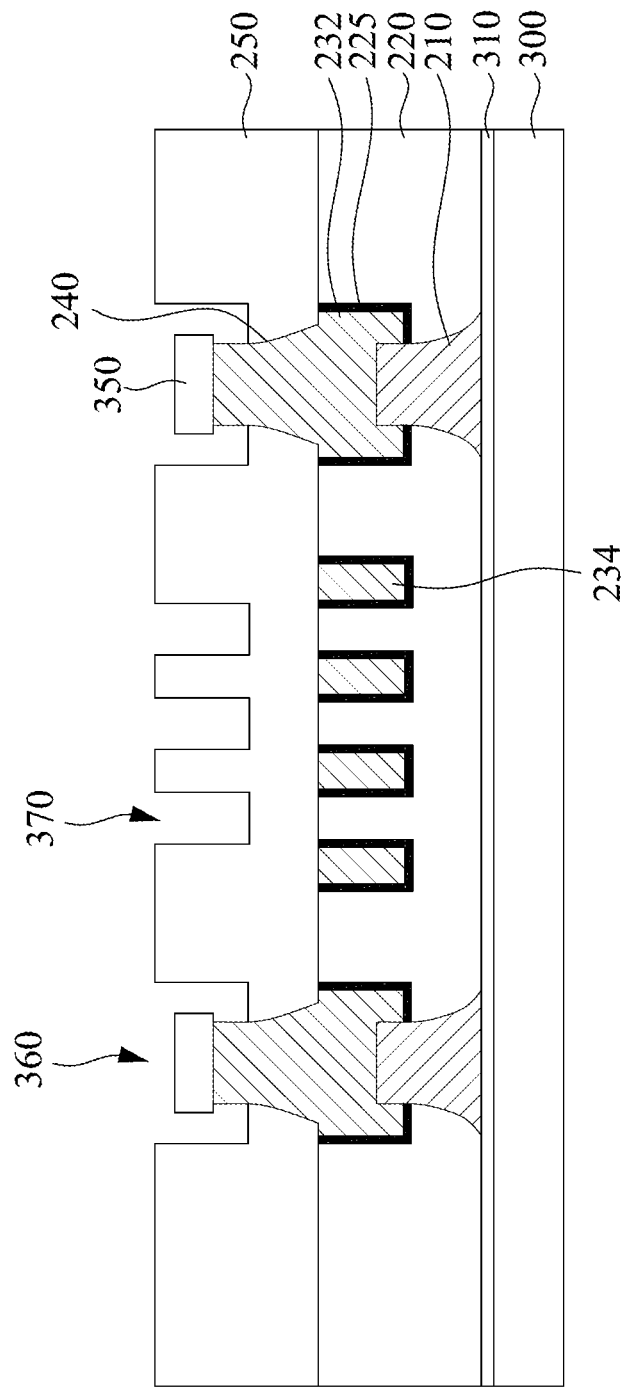

Referring to FIG. 2O, the second dielectric layer 250 is patterned to form at least one second opening 360 exposing the second patterned mask layer 350. Specifically, the second dielectric layer 250 including the photoimageable dielectric can be exposed and developed to form the second opening 360 in the second dielectric layer 250. The second opening 360 has sufficient area so that the second patterned mask layer 350 may be totally exposed in the second opening 360. The method of patterning the second dielectric layer 250 may be similar to the above-mentioned one for the first dielectric layer 220 in FIG. 2D.

In some embodiments, after patterning the second dielectric layer 250, the bottom surface of the second opening 360 may be lower than the bottom surface of the second patterned mask layer 350. As such, the bottom surface of the second patterned mask layer 350 and a portion of the sidewall of the second conductive post 240 may be exposed in the second opening 360. The shape of the second opening 360 may be similar to that of the first opening 330, and it is not intended to limit the present disclosure.

Pattering the second dielectric layer 250 may further include forming the opening 370 in the second dielectric layer 250. The opening 370 may be positioned in the same patterned layer as the second opening 360, and the opening 370 may have a shape different from that of the second opening 360. In some embodiments, the numbers and shape of the opening 370 may be different from those of the underlying first trace 234, as shown in FIG. 2O.

Figure 2P:
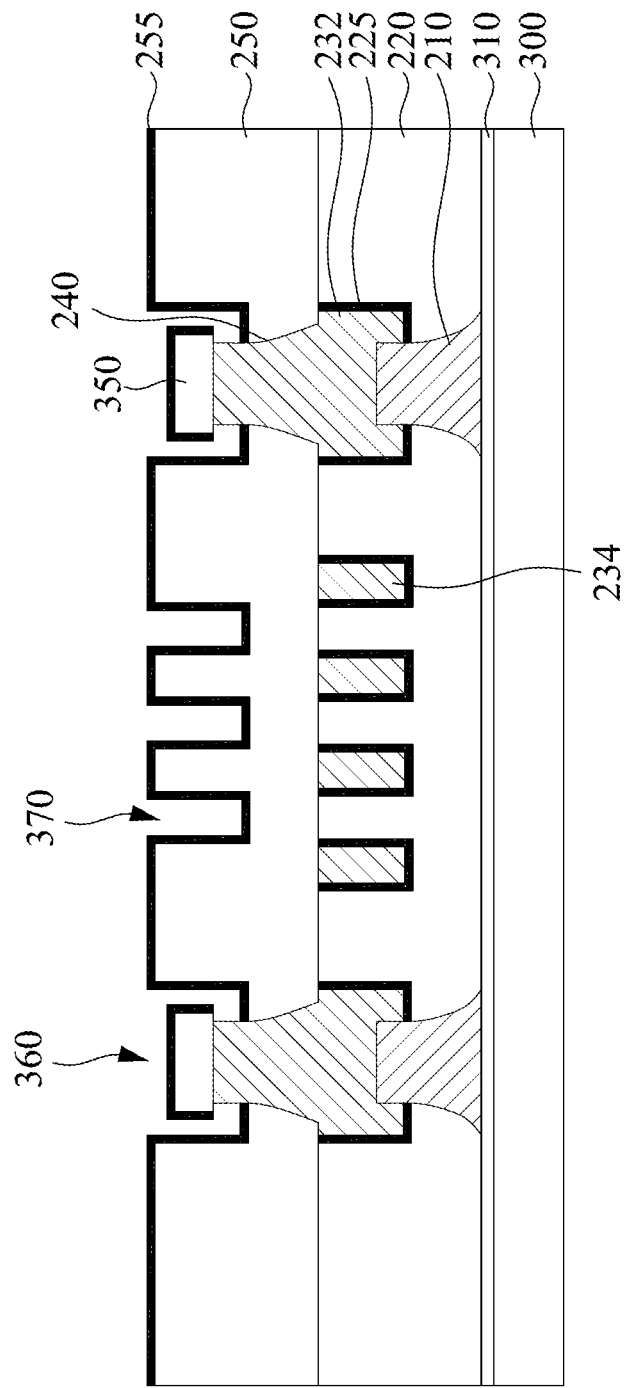

Referring to FIG. 2P, a second seed layer 255 is formed on in the second opening 360 and on the second patterned mask layer 350. Specifically, the second seed layer 255 covers the top surfaces of the second dielectric layer 250 and the second patterned mask layer 350, and the second seed layer 255 also covers the sidewall and the bottom surface of the second opening 360. The method of forming the second seed layer 255 may be similar to the above-mentioned one for the first seed layer 225 in FIG. 2E and FIG. 2F. In the embodiments which the second dielectric layer 250 includes the opening 370, the second seed layer 255 may also be formed in the opening 370 so that the second seed layer 255 covers the sidewall and the bottom surface of the opening 370.

Figure 2Q:
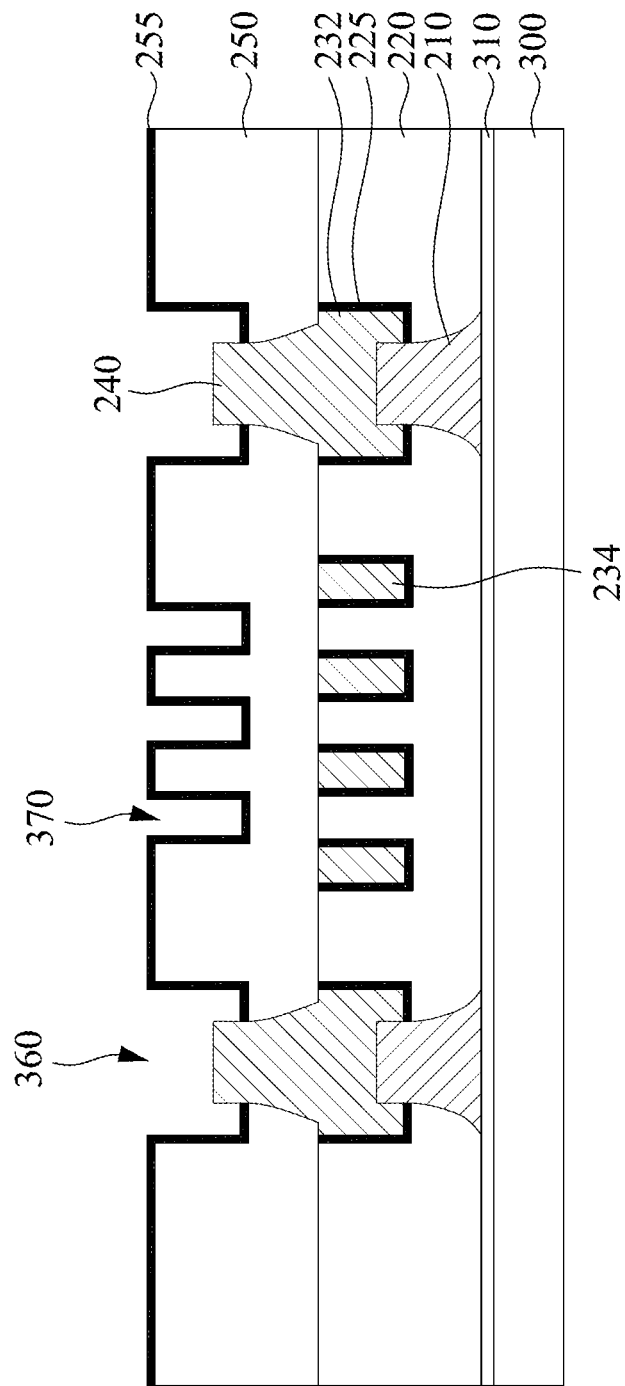

Referring to FIG. 2Q, the second patterned mask layer 350 is removed to expose the top surface of the second conductive post 240. The method of removing the second patterned mask layer 350 may be similar to the above-mentioned one for the first patterned mask layer 320 in FIG. 2H and FIG. 2I. In some embodiments, the top surface of the second conductive post 240 may be higher than the bottom surface of the second opening 360 after removing the second patterned mask layer 350.

Figure 2R:
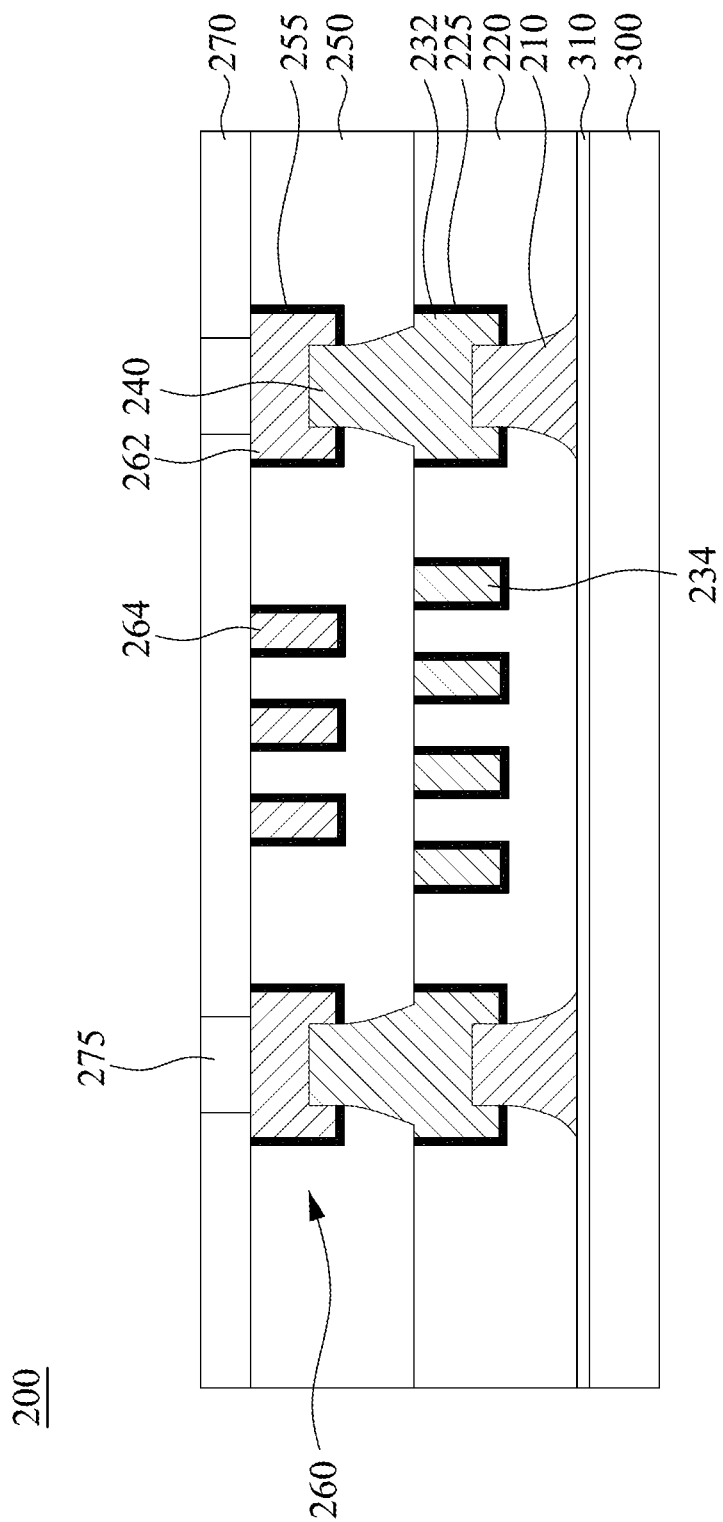
Figure 2S:
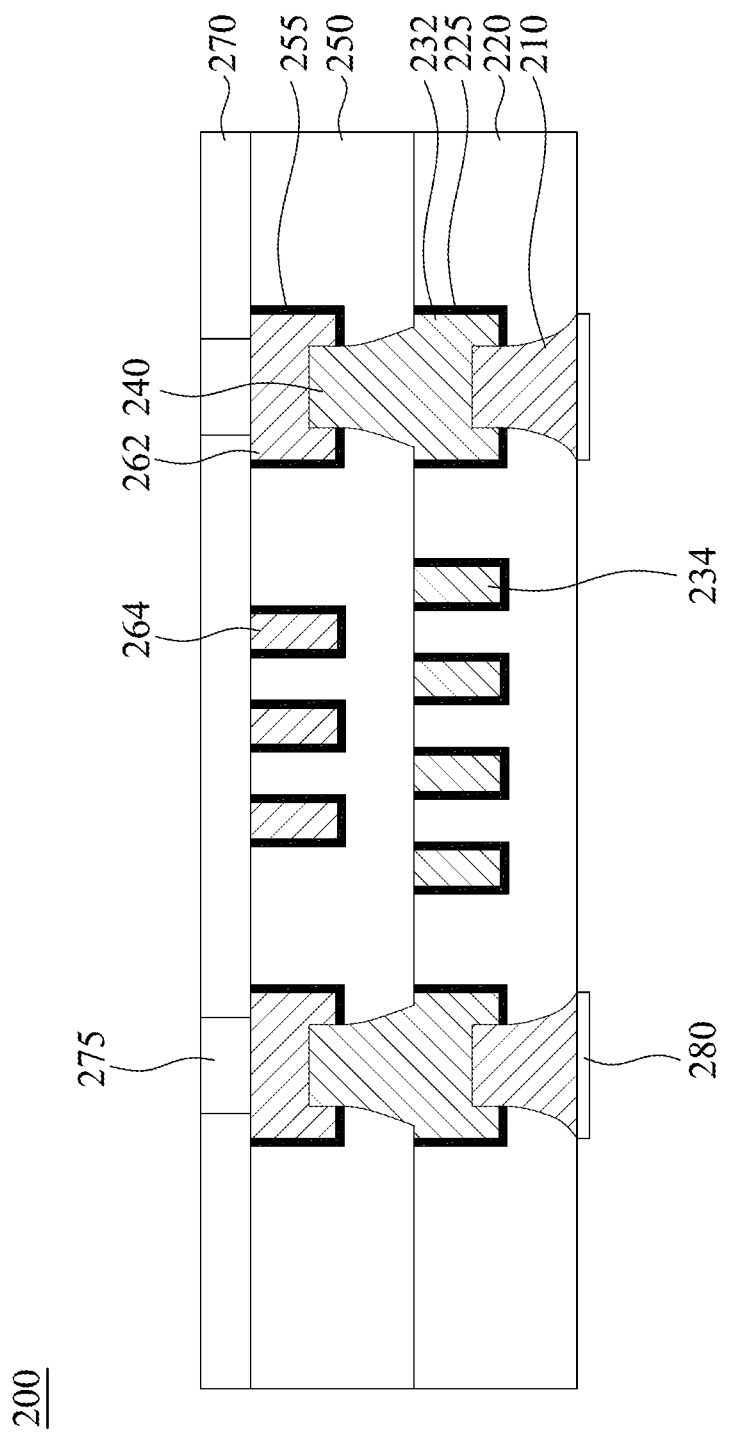

Referring to FIG. 2R, a second pad 262 is directly formed in the second opening 360 and on the top surface of the second conductive post 240, thereby forming the circuit board 200. Specifically, an additional conductive layer (not shown in figures) is formed above the second dielectric layer 250 with a subsequent planarization process, so the additional conductive layer fills the second opening 360 to form the second pad 262.

When the second pad 262 is formed in the second opening 360, the second pad 262 directly contacts the second conductive post 240 so that the second pad 262 and the second conductive post 240 forms a conductive path without the second seed layer 255. Since the second pad 262 directly contacts the second conductive post 240, the conductive path formed by the second pad 262 and the second conductive post 240 has low impedance change. This reduces the signal loss when the current passes through the second pad 262 and the second conductive post 240.

It should be noted that the second conductive post 240 and the second pad 262 are respectively formed from the second conductive layer 230a and the additional conductive layer (not shown in figures) manufactured in different steps, so the seam may exist between the second conductive post 240 and the second pad 262. In some embodiments, the first conductive post 210, the first pad 232, the second conductive post 240, and the second pad 262 may be formed of the same metal material, such as copper metal or alloy formed by the platting process.

In the embodiments which the second dielectric layer 250 includes the opening 370, forming the second pad 262 may further include forming the second trace 264 in the opening 370. In the above-mentioned embodiments, the second pad 262 and the second trace 264 may be formed in the same patterned metal layer, i.e., the second circuit layer 260. In some embodiments, when perform the planarization process to form the second pad 262, the planarization process may also be used to remove the excess second seed layer 255 on the second dielectric layer 250 so that the second dielectric layer 250, the second seed layer 255, and the second pad 262 are coplanar. As a result, the second seed layer 255 may cover the sidewalls and the bottom surfaces of the second pad 262 and the second trace 264 but does not cover the top surfaces of the second pad 262 and the second trace 264.

After forming the second pad 262, an insulation protecting layer 270 may be formed above the second dielectric layer 250 to protect the second pad 262 in the second dielectric layer 250. In addition, the insulation protecting layer 270 may be further patterned to form the opening above the second pad 262. The opening is then filled with a conductive material to form the solder bump 275, so the current signal on the second pad 262 may be transmitted to the elements arranged on the circuit board 200 by the solder bump 275.

In some embodiments, a conductive element may further be formed below the first conductive post 210, so the first conductive post 210 can be electrically connected to other elements or circuit boards. For example, referring to FIG. 2S, the release film 310 and the underlying substrate 300 may be separated from the first dielectric layer 220 so that the bottom surfaces of the first dielectric layer 220 and the first conductive post 210 are exposed. Then, a solder bump 280 may further be formed on the bottom surface of the first conductive post 210. This allows the current signal on the first conductive post 210 to be transmitted to other elements and circuit boards below the circuit board 200 by the solder bump 280.

According to the above-mentioned embodiments of the present disclosure, the circuit board includes the first pad in the first circuit layer, the first conductive post, and the second pad in the second circuit layer. The first pad is directly connected to the first conductive post, and the second pad is connected to and directly contacts the first conductive post at the connecting end opposite to the first pad. The seed layer is positioned neither between the first conductive post and the first pad nor between the first conductive post and the second pad. As such, compared to the general blind hole, the conductive path formed by the first pad, the first conductive post, and the second pad has fewer interfaces. This reduces the impedance change of the conductive path between the first pad and the second pad, which promotes the impedance matching. Therefore, the circuit board of the present disclosure can reduce the current signal loss and improve the signal transmission quality of the circuit board.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A circuit board, comprising:
a first circuit layer, comprising at least one first pad and a first seed layer covering a sidewall of the first pad;
a first conductive post on the first pad and directly connected to the first pad, wherein the first pad and the first conductive post are integrally formed into one piece; and
a second circuit layer comprising at least one second pad and a second seed layer covering a sidewall of the second pad, wherein the second pad is on a first connecting end of the first conductive post, the first connecting end is embedded in the second pad, and the second pad is connected to and directly contacts the first connecting end,
wherein the first seed layer and the second seed layer do not extend on a sidewall of the first conductive post, and
wherein the second seed layer comprises a first bottom portion contacting the first conductive post and a side portion covering the sidewall of the second pad, and a thickness of the first bottom portion is thinner than a thickness of the side portion.

2. The circuit board of claim 1, wherein a top surface cross-sectional area of the first connecting end of the first conductive post is smaller than a bottom surface cross-sectional area of the first conductive post on the first pad.

3. The circuit board of claim 1, wherein an angle between the sidewall of the first conductive post and a top surface of the first pad is an acute angle.

4. The circuit board of claim 1, further comprising a dielectric layer covering the first circuit layer and surrounding the first conductive post and the second circuit layer, wherein the dielectric layer directly contacts the first conductive post.

5. The circuit board of claim 4, wherein the dielectric layer directly contacts a top surface of the first pad.

6. The circuit board of claim 1, wherein the first seed layer further covers a bottom surface of the first pad.

7. The circuit board of claim 1, wherein the second seed layer further covers a bottom surface of the second pad.

8. The circuit board of claim 1, further comprising a second conductive post below the first pad, wherein the second conductive post has a second connecting end embedded in the first pad, and the first pad is connected to and directly contacts the second connecting end.

9. The circuit board of claim 1, wherein the first circuit layer further includes at least one first trace, the first seed layer covers a sidewall and a bottom surface of the first trace but not a top surface of the first trace.

10. The circuit board of claim 1, wherein the second circuit layer further includes at least one second trace, and the second seed layer covers a sidewall and a bottom surface of the second trace but not a top surface of the second trace.

11. The circuit board of claim 1, wherein the second seed layer comprises a second bottom portion connecting the first bottom portion and the side portion, and the thickness of the first bottom portion is thinner than a thickness of the second bottom portion.

* * * * *